United States Patent

Marshall

[19]

[11] Patent Number: 5,774,387
[45] Date of Patent: Jun. 30, 1998

[54] TRACKING FILTER

[75] Inventor: Stephen W. Marshall, Richardson, Tex.

[73] Assignee: Texas Instruments Incorporated, Dallas, Tex.

[21] Appl. No.: 662,803

[22] Filed: Jun. 12, 1996

[51] Int. Cl.$^6$ .................................................. G06F 17/10
[52] U.S. Cl. ................................ 364/724.011; 364/825; 327/552
[58] Field of Search ...................... 364/724.011, 724.19, 364/825; 327/552

[56] References Cited

U.S. PATENT DOCUMENTS

| | | | |
|---|---|---|---|
| 3,925,640 | 12/1975 | Duggan | 235/150.1 |
| 4,077,015 | 2/1978 | Carson | 364/825 |
| 4,682,116 | 7/1987 | Wolaver et al. | 327/552 |
| 5,394,036 | 2/1995 | Hanna | 327/552 |
| 5,572,558 | 11/1996 | Beherns | 364/724.011 |

*Primary Examiner*—David H. Malzahn
*Attorney, Agent, or Firm*—Robert C. Klinger; James C. Kesterson; Richard L. Donaldson

[57] ABSTRACT

A tracking filter (10,80) which transitions from a type 2 loop to a type 1 loop as the loop error approaches 0 for fast settling and convergence without overshoot or ringing. The filter can either be implemented as an analog circuit (10) in hardware or digitally (80) in software. A first integrator (30) or first accumulator (82) is utilized to increment or decrement a discriminator (22,96) output error value as long as the sign of its output (32) from the previous iteration is the same as a sign of the error signal provided to its input (26) by the error discriminator (22,96). The first integrator output is limited to a range by a limiter (42) between a minimum and maximum value. If the sign of the first integrator output is different from the sign of the input, the contents of the first integrator or accumulator are dumped. The output from the first integrator or first accumulator has binary scaling (44, 94) to scale its value before adding it to a second integrator (50) or second accumulator (88).

9 Claims, 4 Drawing Sheets

TRACKING FILTER

CROSS REFERENCE TO RELATED APPLICATIONS

Cross reference is made to the following commonly assigned co-pending patent application, the teachings incorporated herein by reference.

| Ser. No. | Title | Date Filed |
|---|---|---|
| 08/662,192 | Low-Cost Phase-Lock Motor Control Method and Architecture | 06/13/95 |

FIELD OF THE INVENTION

The present invention relates generally to a tracking filter, and more particularly to a tracking filter having a long time constant (low bandwidth) for smoothing signals in the presence of errors and noise, and also having a fast settling time without overshoot required for sustained errors such as a step input.

BACKGROUND OF THE INVENTION

In many control system applications, a long time constant (low bandwidth) filter is need to smooth statistical measurement errors and noise. At the same time, fast settling without overshooting is required for sustained errors, such as a step input. Conventional analog type 2 (second order) tracking loops can be made with arbitrarily small bandwidths to handle the smoothing requirements. However, in order to get fast settling, overshoot or ringing will be present in the pass band. Increased damping reduces overshoot and ringing, but increases susceptibility to transient responses.

Conventional digital implementations of a second order loop require at least three multipliers. This digital implementation is hardware intensive and relatively expensive. The analog implementation of a second order loop requires at least two operational amplifiers and associated trimming components. One conventional analog filter, known as a Chebyshev filter, has a very small, equal, ripple-shape characteristic in the transmission band of the filter. While suitable as a low pass filter in many control system applications, it is very difficult to achieve fast settling times without utilizing a high-order filter, which is hardware intensive and expensive.

In video display systems, such as televisions, and computer graphic terminals, the display must be synchronized to the vertical frame rate of the video signal. One method of synchronization requires an accurate measurement of the vertical sync VSYNC period. VSYNC period is determined by counting the number of reference clock pulses occurring between VSYNC pulses. Typically, the VSYNC period data is passed through a lowpass filter to smooth measurement errors associated with noise on the signal, quantization, and singularities that may be generated by changing channels and acquiring a new VSYNC pulse from the new channel.

In addition, the input sources for the display system can have varying VSYNC periods, due to the fact that different sources have different display rates. For instance, an NTSC formatted signal has a 60 hertz display rate, and thus, a 16.67 millisecond vertical sync period. In a PAL display system, the frame rate is 50 hertz, and thus, the vertical sync period is 20 milliseconds. In computer graphics generated signals, a 72 hertz display rate is common, corresponding to a 13.6 millisecond vertical sync period.

When switching sources from, for instance, an NTSC signal to a PAL signal, the vertical sync period will instantaneously change from 16.66 milliseconds to 20 milliseconds. The analog or digital tracking signal representative of this period, as used in the tuning portion of the display system, will "step" from one stable level representative of 16.67 milliseconds to a second stable level representative of 20 milliseconds. A low pass bandwidth filter is utilized to smooth this transient and avoid responding to singularities during this transition. Again, typical inexpensive low pass filters that are relatively simple in complexity have a slow settling time, overshoot and ringing.

There is a need to provide a low bandwidth tracking filter that is low cost, simple, and having a fast settling time with no overshoot or ringing in the transmission bandwidth region. Such a filter would be suitable for many applications, including display systems, that require the processing of a low frequency signal, wherein fast settling with little or no overshoot or ringing is required.

SUMMARY OF THE INVENTION

The present invention achieves technical advantages as an inexpensive tracking filter that transitions from a type 2 loop to a type 1 loop as the loop error approaches zero for fast settling without overshoot. An error discriminator is utilized to quantize error levels between the filter output and filter input to −1, 0 or +1. The damping gain of the type 2 loop is set to one, whereby in the digital embodiment the quantization and damping gain of one allows integration in accumulators using just increments or decrements. The low damping gain produces a highly underdamped loop response for fast convergence. To prevent overshoot, the accumulator in the digital embodiment, and an integrator in the analog embodiment, dumps its contents whenever the sign of its output and the error do not match. Binary scaling, with truncation, is utilized to scale (divide-by-$2^n$) the first integrator (accumulator) before adding it to a second integrator (accumulator). The scaling truncation and dumping causes transition from type 2 to type 1 loop as the error from a step input transitions from sustained to stochastic (alternating on noise) because the first integrator (accumulator) output is limited and never integrates up to a significant level. The filter utilizes no multipliers, has fast convergence for sustained error conditions, and is a type 1 loop for long time constant filtering.

The filter according to the present invention can be embodied in hardware as a discrete analog filter, or implemented digitally in software using a microcontroller. The filter includes a first circuit receiving a filter input signal and a feedback signal from the filter output, this first circuit providing a first signal indicative of a difference (error) therebetween. An error discriminator/quantizer provides a first output indicative of a sign of the first signal. A first integrator having an input receiving the discriminator first output provides a second signal to its output. This first integrator further comprises means to reset its second signal to a predetermined value, preferably zero, when a sign of its second signal is opposite the sign of the received first signal. In the digital version, this first integrator is an accumulator which dumps its contents when the sign of its output is the opposite of the sign of its input. A second circuit adds the second signal from the first integrator to the first output from the error discriminator, and generates a third signal being indicative of this addition. Alternatively, the second circuit could add a second signal from the error discriminator that is indicative of the error magnitude. Preferably, the magnitude of the discriminator second signal is identical to the magnitude of the first circuit first signal when the first circuit first signal is within a range of predetermined values. In other words, when the difference (error) between the input signal to the first circuit and the feedback signal is a large difference, the discriminator second output related to the discriminator second output related to the first circuit first signal is limited to a maximum and minimum predetermined value to limit the integration of the filter each iteration. A second integrator integrates this third signal and provides its output to the filter output.

In the preferred embodiment of the present invention, the filter further comprises an integer-divide circuit, with truncation, receiving the first integrator second signal to provide scaling. This circuit performs an integer-divide to the second signal, and outputs the truncated integer divided second signal to the second circuit for addition. In this way, several iterations of the first integrator (accumulator) are required before the output of the integer-divide circuit increments.

In the digital embodiment, when the filter is implemented in software using a microcontroller, for instance, the method of the present invention comprises the steps of subtracting a feedback signal at the filter output from an input signal at the filter input to generate a difference (error) signal related to a difference therebetween. Next, a sign of this difference signal is determined. A first accumulator is incremented or decremented corresponding to the sign of this difference signal. However, the accumulator is reset to a predetermined value, preferably dumped and returned to zero, if the sign of the difference signal is the opposite of the sign of the accumulator's previous output signal. In other words, the accumulator continues to accumulate, with limitation, until the sign of its input signal is determined to be different than the sign of its output signal from the previous iteration, at which time the accumulator dumps its contents.

The output of the first accumulator is added to the difference signal and the sum presented to a second accumulator. The output of the second accumulator is provided to the filter output. Preferably, an integer divide operation, with truncation, of the first accumulator output signal is performed before adding this signal to the difference signal to provide scaling. The difference signal provides a damping gain. The accumulators function as integrators, whereby the contents of the first accumulator is dumped when the sign of the accumulator's contents is different than the sign of the difference signal provided to the first accumulator's input. This minimizes overshoot, whereby truncation by the integer divide circuit and dumping causes the filter to transition from a type 2 loop to a type 1 loop for a long time constant filtering. No multipliers are implemented, and the filter achieves fast convergence for sustained error conditions.

DESCRIPTION OF THE PREFERRED EMBODIMENT

Figure 1:
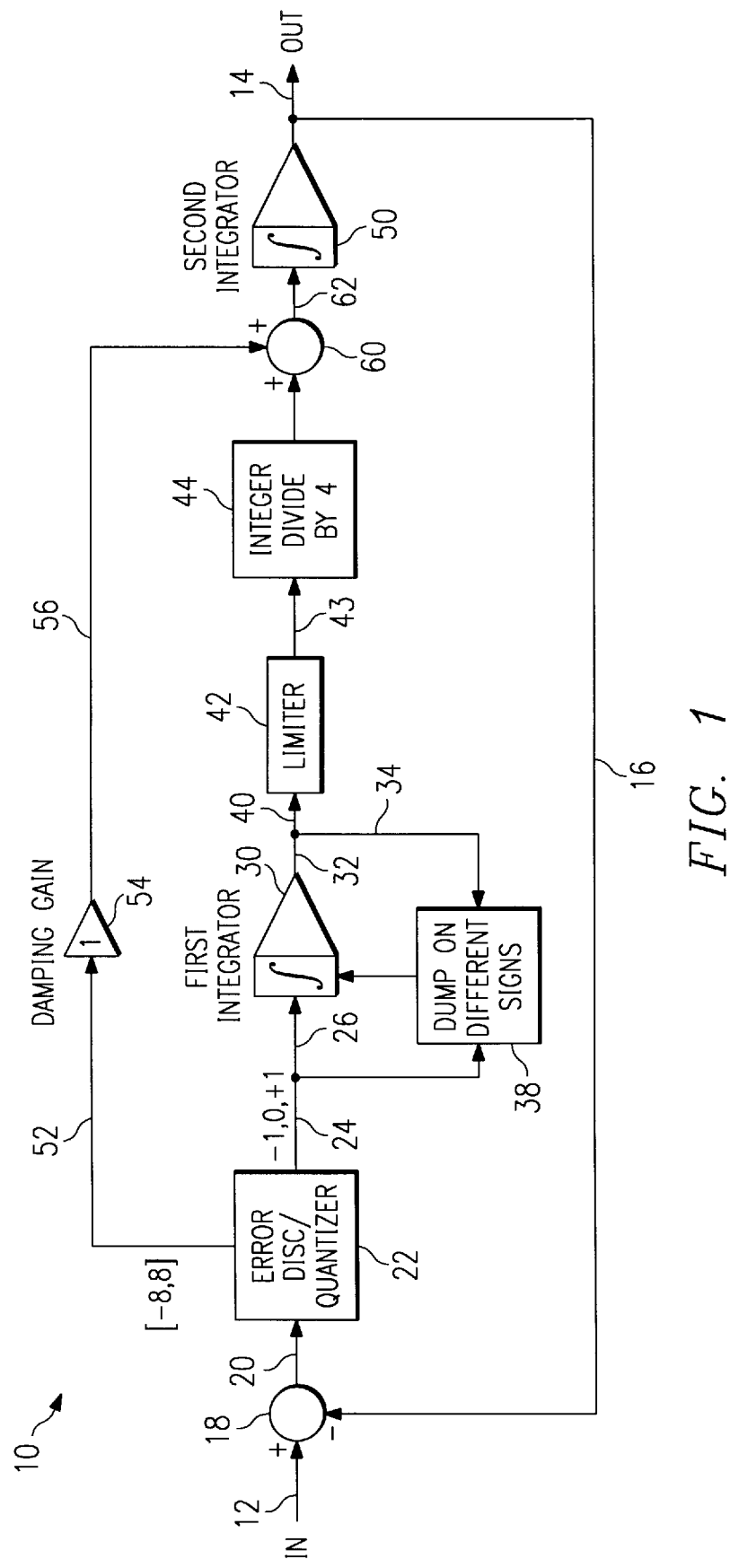
FIG. 1 is a block diagram of a tracking filter according to the preferred embodiment of the present invention illustrated as an analog circuit.

Referring now to FIG. 1, there is generally shown at 10 a tracking filter according to one preferred embodiment of the present invention implemented in hardware as an analog circuit. The filter input is received on line 12 with the output of the filter being provided on output line 14. A feedback signal is provided from output line 14 to feedback line 16, the feedback signal on line 16 being subtracted from input signal on line 12 at 18, such as using an operational amplifier. The difference (error) of these two signals in provided on line 20 to an error discriminator/quantizer 22. Error discriminator/quantizer 22 provides a unit output having a sign of −1, 0, or +1 the sign corresponding to the sign of the difference signal provided on line 20. If the difference signal provided on line 20 has a positive sign, an output of +1 units is provided on output line 24. If there is no difference signal on line 20, that is, wherein the input signal on line 12 and the output signal on line 14 are identical, the output of the error discriminator 22 is 0. If, the sign of the difference signal on input line 20 is a negative sign, an output of −1 unit is provided on output line 24.

If filter 10 is utilized to process an analog signal representative of the time period of a vertical sync VSYNC pulse associated with the data being processed by a display system, the units provided by error discriminator/quantizer 22 are in units of time as well. If the value of the input signal provided on line 12 corresponds to a VSYNC period of about 16.67 milliseconds, this VSYNC period corresponding to a 60 hertz display rate, which is typical of an NTSC signal, the unit step output on line 24 is about 0.4 microseconds.

The unit output provided on line 24 is provided to the input 26 of a first integrator 30, being, for instance, an operational amplifier. The output of integrator 30 is provided on line 32, whereby the output is provided as feedback on line 34 to a comparator circuit 38. Circuit 38 also is tied to the input 26 of integrator 30, as shown. Circuit 38 compares the sign of the input to the first integrator 30 with the sign of the output signal of the integrator 30, and causes first integrator 30 to dump it contents, that is, return the output to a predetermined, 0 value if the signs do not match, that is, are opposite one another. If, on the other hand, the sign of the input signal on line 26 is the same sign as the output signal of integrator 30, circuit 38 does nothing, and allows integrator 30 to continue integrating the signal.

The output of integrator 30 is first provided on line 40 to a limiter 42, such as a pair of zener diodes, this limiter 42 limiting the range of the integrator output. The output of limiter 42 is then provided on line 43 to an integer divide circuit, with truncation, generally shown at 44. In a preferred embodiment, this integer divide circuit 44 is preferably a divide-by-4 circuit. Thus, the output of the integer divide circuit 44 provided on line 48 only increments 1 unit for ever 4 increments provided on input line 40. This integer divide circuit 44 uses binary scaling, with truncation, to scale the first integrator value before it is subsequently added to a second integrator, generally shown 50.

An output signal related to the magnitude and sign of the difference signal on line 20 is also provided by error discriminator 22 on line 52 to a unity gain amplifier 54, which provides a unity damping gain. This output has a maximum of 8 units, and a minimum of −8 units, this output being proportional to the difference signal on line 20 when the output is within this range. In an alternative embodiment, line 24 could be connected to amplifier 54 in place of line 52 if desired. The output of amplifier 54 is provided to line 56 and summed at 60 with the output of the integer divide circuit 44. The output of this summation, is provided on line 62 to the input of the second integrator 50.

Figure 3:
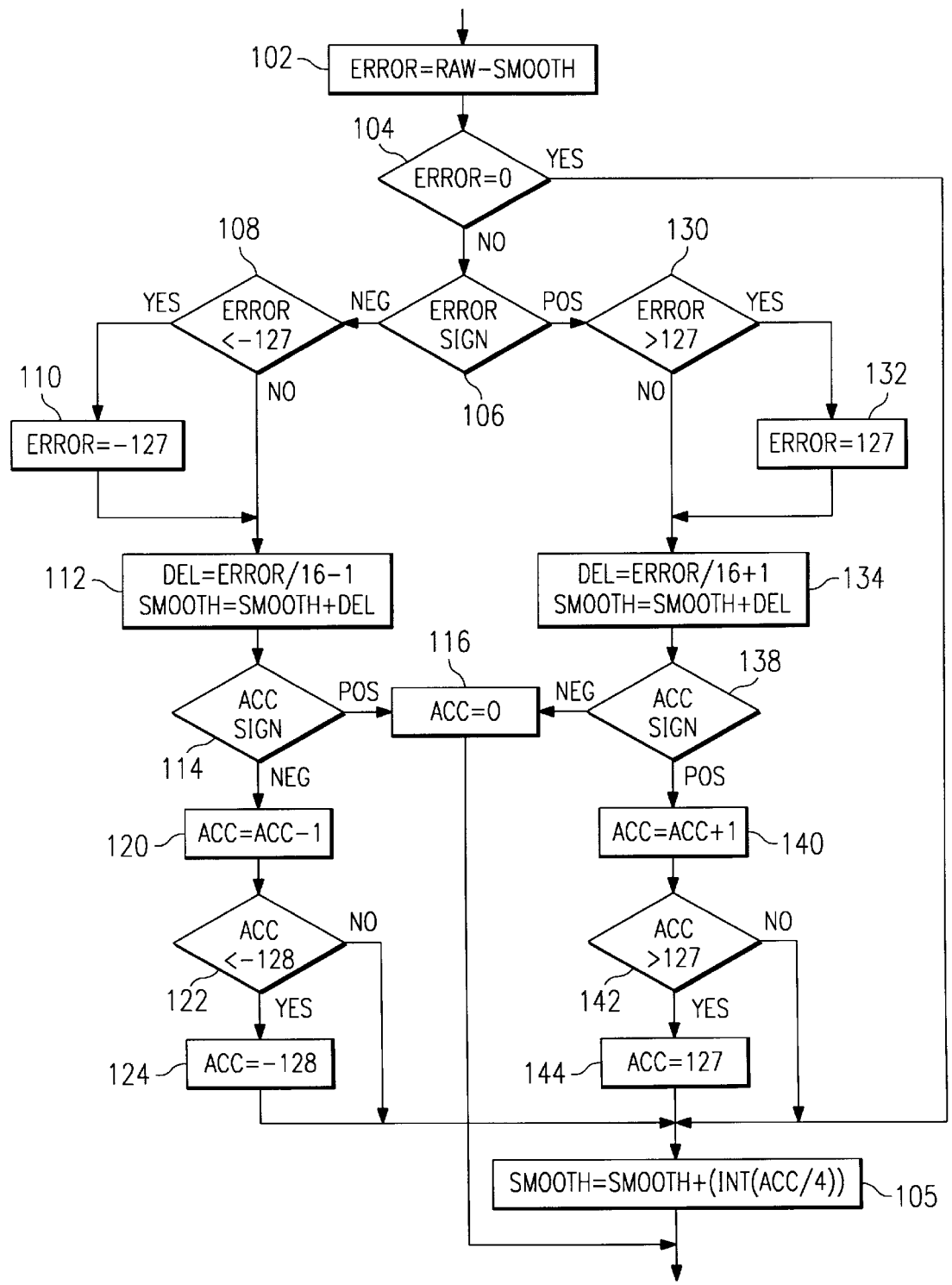
FIG. 3 is a flow chart of the digital tracking filter shown in FIG. 2, whereby the contents of the first accumulator is dumped when the signs of the input and the output of the accumulator are different.

As will be shown by example shortly in reference to the flow diagram to FIG. 3, when a large step input is provided on the filter input line 12, the output of filter 14 will quickly ramp up to match the input due to the summation at 60 of the values provided on input lines 48 and 56. For each iteration of the loop, at least one unit will be added due to the unity damping gain provided on line 56. To achieve a quick ramp up to the output value, integrator 30 continues to integrate the input signal on line 26, with limitation, this integrated signal being first divided by the integer divide circuit 44, with truncation, and being summed at 60. The output signal on line 48 eventually contributes a majority of the signal at 60 when the first integrator 30 is permitted to integrate, that is, whereby circuit 38 determines the sign of the input signal and the output signal to match.

Once filter 10 achieves an output equal to, and usually slightly greater than initially, the input signal, the output provided on feedback line 16 back to 18 causes the value of the error discriminator 22 to change. At this time, the signs of the input signal on line 26 and the output signal provided on 32 will not match, that is, they are opposite, and thus the first integrator 30 will have its output reset to 0. During this iteration, only a −1 unit value will be passed by damping gain amplifier 54 to summation circuit 60, and integer divide circuit 44 contributes nothing. Second integrator 50 will then decrement the output at 14 by 1 unit.

If there is any overshoot, the error remains −1 and the algorithm just described which ramped the output up, say, from a value indicative of 16.67 milliseconds to 20 milliseconds, will now decrement the output in the same way until the input and the output value are about the same, that is, a unit value indicative of 20 milliseconds. Because the value at output 14 may swing slightly past 20 milliseconds due to the weighting of the first integrator 30 and the integer divide circuit 44, several iterations may be required before the output comes back down to about 20 milliseconds. If four iterations are required, on the forth iteration the integer divide-by-4, shown at 44, will be implemented and contribute an output at 48, although this contribution will have a negative sign as will the damping input unit on 56. The output from 60 will cause integrator 50 to bring the output at 14 back down to a value representative of 20 milliseconds. At equilibrium, the output of second integrator 50 will dither back and forth about a value indicative of 20 milliseconds due to the damping gain from amplifier 54. The first integrator 30 will continue to be disabled as the signs of the input and output signals will continue to be opposites. With the first integrator 30 functionally unoperational, only second integrator 50 is utilized and the filter transition from a type 2 loop to a type 1 loop.

Figure 2:
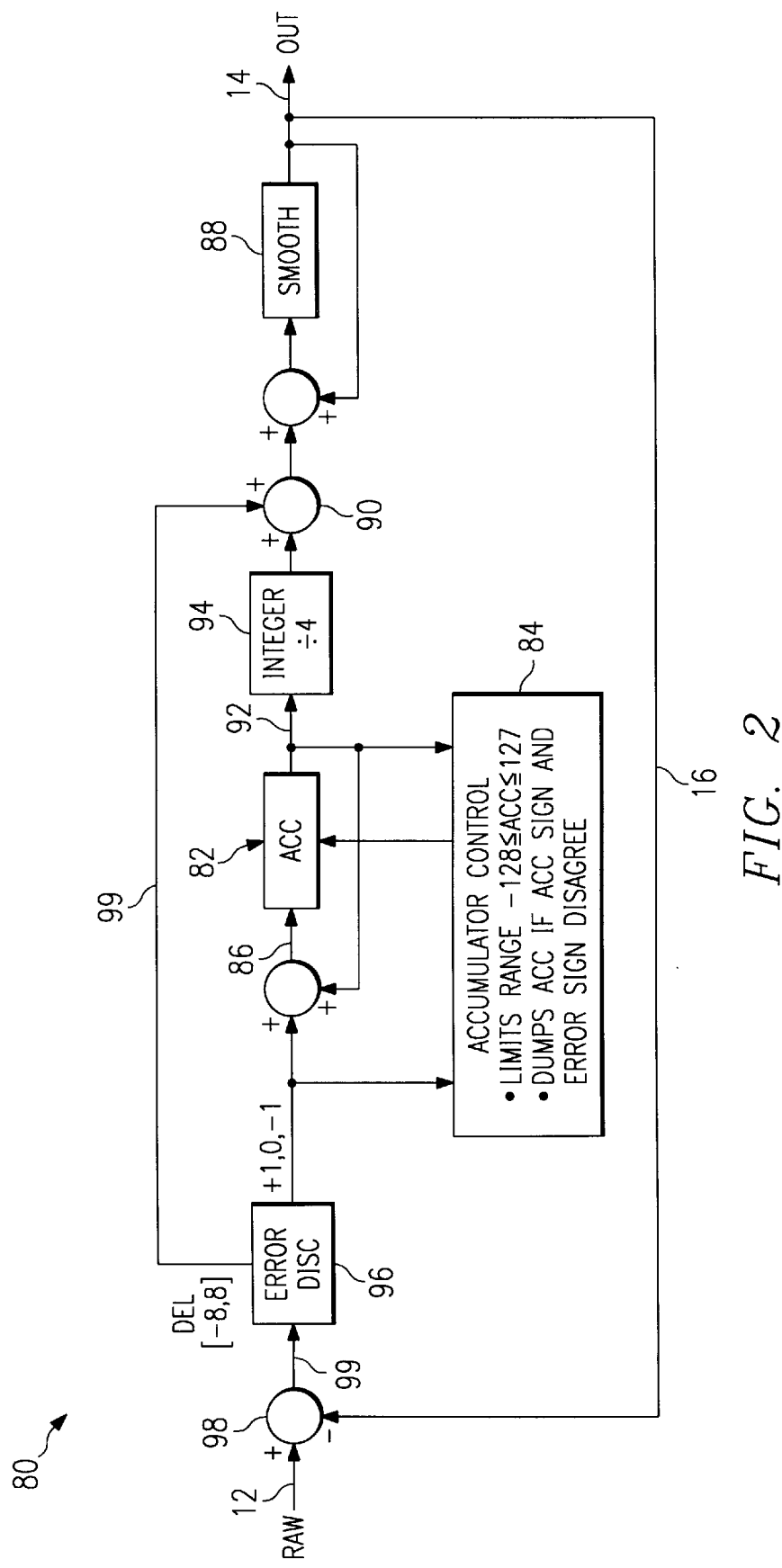
FIG. 2 is a block diagram of a digital preferred embodiment of the filter implemented in software using a microcontroller.

Referring now to FIG. 2 there is shown a block diagram of a digital implementation of the preferred embodiment of the filter at 80, utilizing a microcontroller. As compared to the analog filter of FIG. 1, all the signal processing is done digitally in software, where by an accumulator 82 is utilized as the first integrator 30 and an accumulator 88 is used as the second integrator 50. The first accumulator is generally shown at 82, and has an accumulator control shown at 84. Control 84 limits the accumulator to the range of −128 to +127, and dumps the contents of accumulator 82 if the sign of its contents and the error sign provided to its input at 85 are opposites. Both accumulators 82 and 88 are comprised of adders having a latch. Accumulator 88 is always implemented, and will either increment or decrement depending on the summed value at 90. Again, accumulator 82 will only increment or decrement when the signs of its input and output match for that iteration. The more times that accumulator 82 is permitted to increment and latch, the greater the output on output line 92 to an integer divide-by circuit 94, and thus the greater the contribution ultimately summed at 90.

An error discriminator/quantizer 96 is seen to provide an output on line 97 that corresponds in sign and scaled magnitude to the difference (error) signal provided by adder 98 on input line 99. The minimum and maximum unit values of the output, respectively, on line 97 is −8 and +8 units. Thus, if the difference on line 99 is greater than or equal 8 units on input line 20, the output on line 97 will be 8 units. If the difference is equal to or less that −8 units, the unit value on line 97 is −8 units. Of course, the value of these minimum and maximum unit values can be other than 8, and limitation is not to be inferred in the present invention. Rather, the maximum and minimum unit value is chosen to provide the base increment/decrement value to be summed by accumulator 88 each iteration. As the input of the filter transitions significantly, such as a step input, the majority of the accumulation at accumulator 88 will be provided by the accumulator 82 output, after the output is divided by the integer divide circuit 94.

By way of illustration, if a 2.5 megahertz clock is utilized such that each clock pulse is indicative of 0.4 microseconds, for a digital input signal indicative of 16.67 millisecond VSYNC period corresponding to a 60 hertz frame rate, a digital input of 41667 units if provided to adder 98. If the input at 98 should become indicative of a 20 millisecond VSYNC period, which corresponds to a digital input of 50,000 units in this example, the output at 14 will increment slowly at first, and then more quickly as the contents of accumulator 82 increase, to a maximum accumulator value of 127. Due to the divide-by-4 circuit 94, the maximum incremental contribution at 90 from accumulator 82 is 31 units, or 12.4 microseconds. The maximum incremental value from the damping loop on 97 is 8 units, or 3.2 microseconds, for a total increment of 15.6 microseconds.

To further illustrate the transient response of filter 80, a flow diagram of the operation of filter is shown in FIG. 3 and will now be discussed in considerable detail. At step 102, a signal ERROR is determined by adder 98 to be the difference of the SMOOTH signal at output line 14 from the input signal RAW at input 12. At step 104, the error discriminator 96 determines if the ERROR value is equal to zero. If the ERROR value is zero, the filter output SMOOTH is incremented at step 105 to include the previous value plus the truncated accumulator 82 value divided by 4. Thus, if the value of the input RAW does not change, the output value SMOOTH at 14 will remain the same when the accumulator 82 has a zero value, that is, ACC is zero.

At step 106, when the value of ERROR is not determined to be zero, the sign of ERROR seen by discriminator 96 at 99 is determined. If the ERROR sign is negative, step 108 is preformed to determine if the ERROR value is less than −127 units. If it is, the ERROR value is set to be −127 at step 110, otherwise, the ERROR value is left as is. At step 112 a delta value, DEL, is set to equal the value of ERROR divided by 16, −1. Since the smallest value of the ERROR is −127, the smallest value of the DEL is −8. The output value SMOOTH from the accumulator 88 is then set to equal the previous value plus the delta value DEL.

Next, as step 114, the sign of the content ACC of accumulator 82 is determined. If the sign of ACC from the previous iteration of accumulator 82 was positive, and the sign of ERROR provided by the discriminator 96 is currently being negative, there is difference in signs between the two. Thus, the value of ACC in accumulator 82 is reset to 0, and its contents are thus dumped at step 116. If, however, at step 114 the sign of the accumulator ACC from the previous iteration is still negative, step 120 is performed whereby the accumulator content ACC is decremented by one unit. Next, step 122 is performed to determine if the accumulator value ACC is less than −128 units, which is the minimum value permitted. If it is, the accumulator value ACC is retained at −128. If not, the accumulator value ACC is left as is, whereby step 105 is performed. The integer value of ACC divided by 4, truncated, and added to previous value of SMOOTH. A new value of SMOOTH is established if ACC is 4 or greater.

Referring back to step 106, if the sign of ERROR was determined to be positive, step 130 is preformed to determine if the value of ERROR is greater than 127. If it is, the value ERROR is maintained at 127 at step 132. If not, the value of ERROR is left as is. Next, step 134 is performed whereby the delta value DEL is set to be the value of ERROR divided by 16, +1. Thus, the maximum value DEL for the value is +8. The SMOOTH value is incremented to equal the previous value of SMOOTH plus this delta value DEL. Next, at step 138, the sign of ACC of accumulator 82 from the previous iteration is determined. If it was negative with the input sign of ACC now being positive, the value of ACC is reset at step 116 to equal zero, and thus, the contents are dumped. If the sign of ACC from the previous iteration is also positive, the accumulator value ACC is incremented by one unit at step 140. At step 142, the value of ACC is determined it see if it is greater than 127 units. If it is, the value of ACC is maintained at 127. If not, the value of ACC is left as is. Next, step 105 is preformed to increment the value of SMOOTH to be SMOOTH plus the truncated integer value of ACC divided-by-4.

It can be seen that for a large step input, the value of the accumulator ACC will continue to increment or decrement each iteration of the filter, with the maximum increment of SMOOTH being 39 units, that is, the truncated integer value of 127 divided by 4, plus 8 units from the damping gain portion on line 97 to adder 90. Once the filter output SMOOTH has incremented or decremented to or past the input value RAW, during the next iteration the accumulator control 84 will determine the sign of ERROR at its input at 86 to be different than the sign of ACC in accumulator 82 from the last iteration, and thus dump its contents. For this iteration, only +8 or −8 units (DEL) will be added by the damping gain portion at line 90. If the output SMOOTH on line 14 swings past the input value RAW by more than a few units, subsequent iterations of the filter will cause the contents ACC of the accumulator 82 to increment or decrement such that a non-zero value will be provided by the integer divide circuit 94, thus contributing to more quickly bring in the output SMOOTH on line 14 to be equal to the input signal RAW on line 12.

Figure 4:
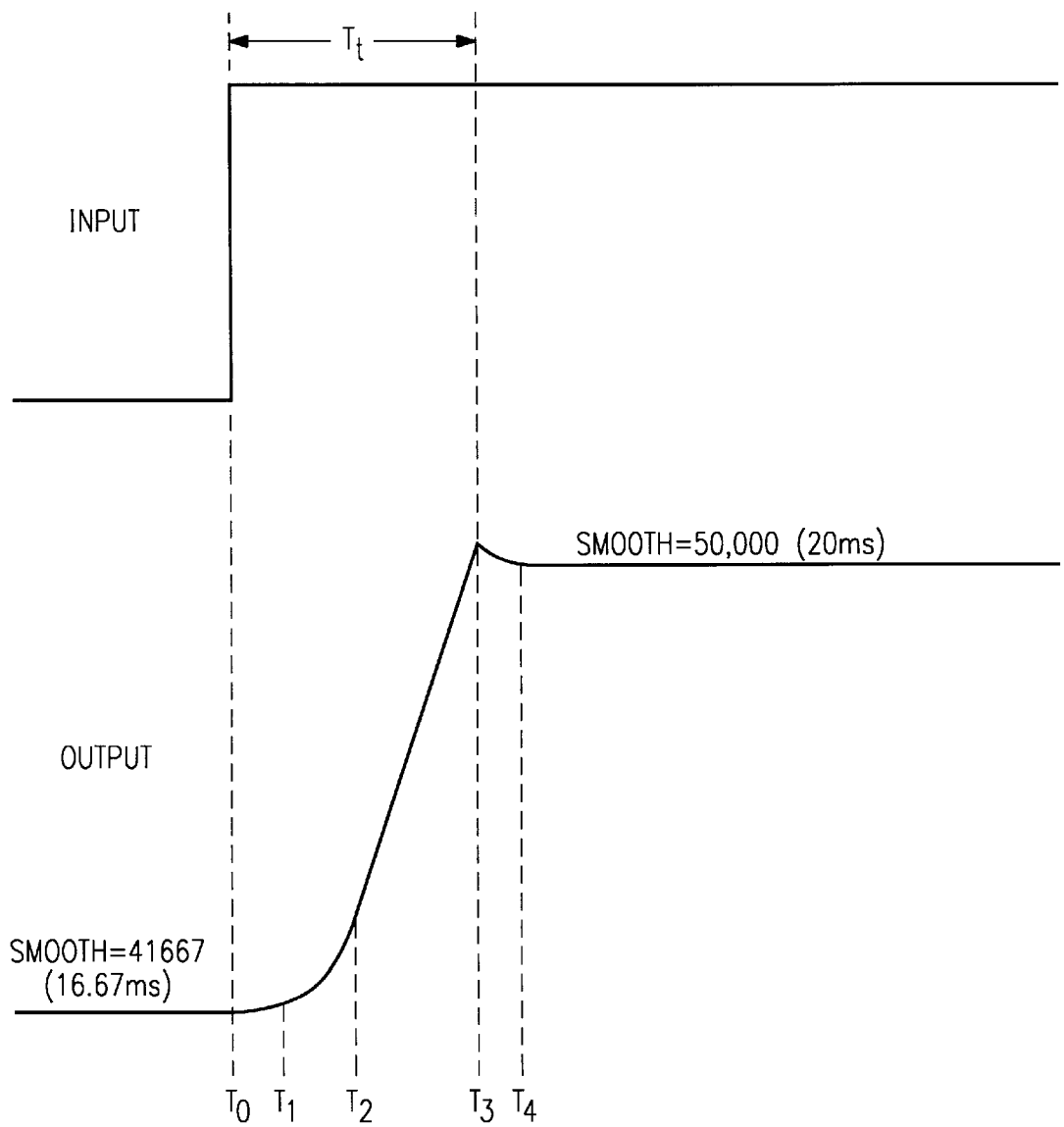
FIG. 4 is a graphical illustration of the filter response compared to a step input whereby the filter output quickly ramps up to match the input signal, and has a fast settling time with minimal overshoot.

To further illustrate how filter 81 quickly transitions and ramps when presented with a step input, with minimum overshoot, reference is made to the graph of FIG. 4. It can be seen that from time $T_0$ to $T_1$, only the damping gain DEL on 97 contributes to the increment of the filter output. From time $T_1$ to time $T_2$, the accumulator value ACC continues to increase, up to a maximum value of 127, and starts to contribute to the ramp. At time $T_2$, the accumulator 82 value ACC equals 127, and the output of the integer divide circuit 94, being truncated, is 31 units. These 31 units, plus the 8 units from the damping gain on 97, total 39 units, and the slope from time $T_2$ to time $T_3$ is 39 units. At time $T_3$, the output value of SMOOTH equals or exceeds the input value of RAW, and on the next iteration, the contents of accumulator 82 will be dumped. As shown, the output value of the filter may slightly overshoot if the contribution of the accumulator 82 during the previous iteration was large enough to cause the new value of SMOOTH to exceed slightly the input value of RAW. From time $T_3$ to time $T_4$, SMOOTH will be decremented until the output value SMOOTH equals the input value RAW. The accumulator 82 may contribute briefly until the output value SMOOTH matches the input value RAW.

As can be appreciated from FIG. 4, the slope of the transfer curve quickly reaches 39 units per iteration, thus providing a fast response time to quickly achieve convergence of the output signal with the input signal. The duration of this convergence is shown as $T_t$. To go from a digital count representative of 16.67 milliseconds to a count representative of 20 milliseconds, the duration of $T_t$ is about 5.5 seconds. It is to be appreciated that this quick convergence time was achieve with minimal overshoot.

Referring to Table 1 below, the value of the filter output SMOOTH each iteration as the input is stepped from a count of 41667 corresponding to 16.67 milliseconds to a count of 50000 corresponding to 20 milliseconds.

| TIME (SEC) | SMOOTH PERIOD (NUM) | SMOOTH PERIOD (MS) |
| --- | --- | --- |
| 0.00 | 41667 | 16.667 |
| 0.02 | 41675 | 16.670 |
| 0.04 | 41683 | 16.673 |
| 0.06 | 41691 | 16.676 |
| 0.08 | 41700 | 16.680 |
| 0.10 | 41709 | 16.684 |
| 0.12 | 41718 | 16.687 |
| 0.14 | 41727 | 16.691 |
| 0.16 | 41737 | 16.695 |
| 0.18 | 41747 | 16.699 |
| 0.20 | 41757 | 16.703 |
| 0.22 | 41767 | 16.707 |
| 0.24 | 41778 | 16.711 |
| 0.26 | 41789 | 16.716 |
| 0.28 | 41800 | 16.720 |
| 0.30 | 41811 | 16.724 |
| 0.32 | 41823 | 16.729 |
| 0.34 | 41835 | 16.734 |
| 0.36 | 41847 | 16.739 |
| 0.38 | 41859 | 16.744 |
| 0.40 | 41872 | 16.749 |
| 0.42 | 41885 | 16.754 |
| 0.44 | 41898 | 16.759 |
| 0.46 | 41911 | 16.764 |
| 0.48 | 41925 | 16.770 |
| 0.50 | 41939 | 16.776 |
| 0.52 | 41953 | 16.781 |
| 0.54 | 41967 | 16.787 |
| 0.56 | 41982 | 16.793 |
| 0.58 | 41997 | 16.799 |
| 0.60 | 42012 | 16.805 |
| 0.62 | 42027 | 16.811 |
| 0.64 | 42043 | 16.817 |
| 0.66 | 42059 | 16.824 |
| 0.68 | 42075 | 16.830 |
| 0.70 | 42091 | 16.836 |
| 0.72 | 42108 | 16.843 |
| 0.74 | 42125 | 16.850 |
| 0.76 | 42142 | 16.857 |
| 0.78 | 42159 | 16.864 |
| 0.80 | 42177 | 16.871 |
| 0.82 | 42195 | 16.878 |
| 0.84 | 42213 | 16.885 |
| 0.86 | 42231 | 16.892 |

-continued

| TIME (SEC) | SMOOTH PERIOD (NUM) | SMOOTH PERIOD (MS) |
|---|---|---|
| 0.88 | 42250 | 16.900 |
| 0.90 | 42269 | 16.908 |
| 0.92 | 42288 | 16.915 |
| 0.94 | 42307 | 16.923 |
| 0.96 | 42327 | 16.931 |
| 0.98 | 42347 | 16.939 |
| 1.00 | 42367 | 16.947 |
| 1.02 | 42387 | 16.955 |
| 1.04 | 42408 | 16.963 |
| 1.06 | 42429 | 16.972 |
| 1.08 | 42450 | 16.980 |
| 1.10 | 42471 | 16.988 |
| 1.12 | 42493 | 16.997 |
| 1.14 | 42515 | 17.006 |
| 1.16 | 42537 | 17.015 |
| 1.18 | 42559 | 17.024 |
| 1.20 | 42582 | 17.033 |
| 1.22 | 42605 | 17.042 |
| 1.24 | 42628 | 17.051 |
| 1.26 | 42651 | 17.060 |
| 1.28 | 42675 | 17.070 |
| 1.30 | 42699 | 17.080 |
| 1.32 | 42723 | 17.089 |
| 1.34 | 42747 | 17.099 |
| 1.36 | 42772 | 17.109 |
| 1.38 | 42797 | 17.119 |
| 1.40 | 42822 | 17.129 |
| 1.42 | 42847 | 17.139 |
| 1.44 | 42873 | 17.149 |
| 1.46 | 42899 | 17.160 |
| 1.48 | 42925 | 17.170 |
| 1.50 | 42951 | 17.180 |
| 1.52 | 42978 | 17.191 |
| 1.54 | 43005 | 17.202 |
| 1.56 | 43032 | 17.213 |
| 1.58 | 43059 | 17.224 |
| 1.60 | 43087 | 17.235 |
| 1.62 | 43115 | 17.246 |
| 1.64 | 43143 | 17.257 |
| 1.66 | 43171 | 17.268 |
| 1.68 | 43200 | 17.280 |
| 1.70 | 43229 | 17.292 |
| 1.72 | 43258 | 17.303 |
| 1.74 | 43287 | 17.315 |
| 1.76 | 43317 | 17.327 |
| 1.78 | 43347 | 17.339 |
| 1.80 | 43377 | 17.351 |
| 1.82 | 43407 | 17.363 |
| 1.84 | 43438 | 17.375 |
| 1.86 | 43469 | 17.388 |
| 1.88 | 43500 | 17.400 |
| 1.90 | 43531 | 17.412 |
| 1.92 | 43563 | 17.425 |
| 1.94 | 43595 | 17.438 |
| 1.96 | 43627 | 17.451 |
| 1.98 | 43659 | 17.464 |
| 2.00 | 43692 | 17.477 |
| 2.02 | 43725 | 17.490 |
| 2.04 | 43758 | 17.503 |
| 2.06 | 43791 | 17.516 |
| 2.08 | 43825 | 17.530 |
| 2.10 | 43859 | 17.544 |
| 2.12 | 43893 | 17.557 |
| 2.14 | 43927 | 17.571 |
| 2.16 | 43962 | 17.585 |
| 2.18 | 43997 | 17.599 |
| 2.20 | 44032 | 17.613 |
| 2.22 | 44067 | 17.627 |
| 2.24 | 44103 | 17.641 |
| 2.26 | 44139 | 17.656 |
| 2.28 | 44175 | 17.670 |
| 2.30 | 44211 | 17.684 |
| 2.32 | 44248 | 17.699 |
| 2.34 | 44285 | 17.714 |
| 2.36 | 44322 | 17.729 |
| 2.38 | 44359 | 17.744 |
| 2.40 | 44397 | 17.759 |

-continued

| TIME (SEC) | SMOOTH PERIOD (NUM) | SMOOTH PERIOD (MS) |
|---|---|---|
| 2.42 | 44435 | 17.774 |
| 2.44 | 44473 | 17.789 |
| 2.46 | 44511 | 17.804 |
| 2.48 | 44550 | 17.820 |
| 2.50 | 44589 | 17.836 |
| 2.52 | 44628 | 17.851 |
| 2.54 | 44667 | 17.867 |
| 2.56 | 44706 | 17.882 |
| 2.58 | 44745 | 17.898 |
| 2.60 | 44784 | 17.914 |
| 2.62 | 44823 | 17.929 |
| 2.64 | 44862 | 17.945 |
| 2.66 | 44901 | 17.960 |
| 2.68 | 44940 | 17.976 |
| 2.70 | 44979 | 17.992 |
| 2.72 | 45018 | 18.007 |
| 2.74 | 45057 | 18.023 |
| 2.76 | 45096 | 18.038 |
| 2.78 | 45135 | 18.054 |
| 2.80 | 45174 | 18.070 |
| 4.86 | 49191 | 19.676 |
| 4.88 | 49230 | 19.692 |
| 4.90 | 49269 | 19.708 |
| 4.92 | 49308 | 19.723 |
| 4.94 | 49347 | 19.739 |
| 4.96 | 49386 | 19.754 |
| 4.98 | 49425 | 19.770 |
| 5.00 | 49464 | 19.786 |
| 5.02 | 49503 | 19.801 |
| 5.04 | 49542 | 19.817 |
| 5.06 | 49581 | 19.832 |
| 5.08 | 49620 | 19.848 |
| 5.10 | 49659 | 19.864 |
| 5.12 | 49698 | 19.879 |
| 5.14 | 49737 | 19.895 |
| 5.16 | 49776 | 19.910 |
| 5.18 | 49815 | 19.926 |
| 5.20 | 49854 | 19.942 |
| 5.22 | 49893 | 19.957 |
| 5.24 | 49931 | 19.972 |
| 5.26 | 49967 | 19.987 |
| 5.28 | 50001 | 20.000 |
| 5.30 | 50000 | 20.000 |
| 5.32 | 50000 | 20.000 |
| 5.34 | 50000 | 20.000 |
| 5.36 | 50000 | 20.000 |
| 5.38 | 50000 | 20.000 |
| 5.40 | 50000 | 20.000 |
| 5.42 | 50000 | 20.000 |
| 5.44 | 50000 | 20.000 |
| 5.46 | 50000 | 20.000 |
| 5.48 | 50000 | 20.000 |
| 5.50 | 50000 | 20.000 |

Initially, it can be seen that the count value of SMOOTH is incremented by only the damping gain, corresponding to time period $T_0$ to $T_1$ in FIG. 4. This increment quickly becomes larger, corresponding to time periods $T_1$ to $T_2$, with the majority of the iterations incrementing SMOOTH by 39 units, corresponding to the time period time $T_2$ to $T_3$. During the last few iterations, it can be seen that the output SMOOTH is brought back down to equal the input RAW for fast convergence.

In summary, the filter according to the present invention can be realized as either a discrete analog circuit, or implemented digitally in software using a microcontroller. A first integrator, or accumulator as the case may be, is dumped whenever the signs of the error presented to the integrator or accumulator do not match the sign of its output from the previous iteration. This prevents overshoot. A limiter limits the range of the integrator/accumulator output. An integer divide circuit provides binary scaling, with truncation, of the integrator or accumulator value before it is added to the second integrator or accumulator. The dumping of the output of the first accumulator or the first integrator causes transition of the filter from a type 2 loop to a type 1 loop when the error from the discriminator approaches zero. The error discriminator is also utilized to quantize the error levels as either a positive error, a negative error, or no error. The first integrator or first accumulator is responsive to this error sign. The second integrator or second accumulator is always utilized. The first accumulator or first integrator contributes with greater weight during subsequent integrations for a large unit step input, as shown graphically in FIG. 4, and illustrated in Table 1.

The filter of the present invention is easily and inexpensively implementable in either hardware or software, and while well suited for filtering a VSYNC input for a display system, it is also well suited for other control system applications.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A filter having an input and an output, comprising:

(a) a first circuit receiving an input signal from said filter input and a feedback signal from said filter output and providing a first signal indicative of a difference therebetween;

(b) an error discriminator providing a first output indicative of a sign of said first signal;

(c) a first integrator having an input receiving said discriminator first output, said first integrator providing a second signal to its output, and further resetting said second signal to a predetermined value when a sign of said second signal is different than a sign of said received discriminate first output;

(d) a second circuit adding said second signal from said first integrator and said first output from said error discriminator, and generating a third signal being indicative of said addition; and (e) a second integrator having an input receiving said third signal from said second circuit and having its output connected to the filter output.

2. The filter as specified in claim 1 further comprising an integer divide circuit receiving said first integrator second signal and performing an integer divide to said second signal, and outputting said integer divided second signal to said second circuit.

3. The filter as specified in claim 1 wherein said error discriminator first output also has a magnitude related to a magnitude of the first circuit first signal.

4. The filter as specified in claim 3 wherein the magnitude of said discriminator first output is identical to the magnitude of said first circuit first signal when said first circuit first signal is less than a predetermined value.

5. The filter as specified in claim 1 further comprising a limiter circuit limiting the magnitude of said first integrator second signal to a predetermined range.

6. A method of processing a signal using a filter having an input and an output, comprising the steps of:

(a) subtracting a feedback signal at the filter output from an input signal at the filter input to generate a difference signal related to a difference therebetween;

(b) determining a sign of said difference;

(c) incrementing or decrementing a first accumulator corresponding to the sign of said difference to provide a first accumulator output signal, but resetting said first accumulator output signal to a predetermined value if the sign of the difference is different than the sign of said previous first accumulator output signal;

(d) adding said first accumulator output signal to said difference signal to generate an add signal;

(e) incrementing a second accumulator having said add signal provided to its input and providing an output to the filter output; and (f) repeating said steps a) through f).

7. The method as specified in claim 6, further comprising the step of performing an integer divide of said first accumulator output signal in said step c) before adding to said difference signal in said step d).

8. The method as specified in claim 6, further comprising the step of dumping the contents of said first accumulator in said step c) when the sign of said first accumulator contents is different than the sign of said difference signal provided to said first accumulator.

9. The method as specified in claim 6 further comprising the step of limiting the value of said first accumulator output signal to a predetermined range.

\* \* \* \* \*